(12) United States Patent
Yao et al.

(10) Patent No.: US 7,403,389 B2
(45) Date of Patent: Jul. 22, 2008

(54) HEAT DISSIPATION DEVICE

(75) Inventors: Zhi-Jiang Yao, Shenzhen (CN); Ning-Yu Wang, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 3 days.

(21) Appl. No.: 11/314,048

(22) Filed: Dec. 20, 2005

(65) Prior Publication Data

US 2006/0274504 A1    Dec. 7, 2006

(30) Foreign Application Priority Data

Jun. 1, 2005    (CN)    ................... 2005 2 0059526

(51) Int. Cl.
*H05K 7/20*    (2006.01)
(52) U.S. Cl. ................ 361/695; 165/80.3; 361/709
(58) Field of Classification Search ................. 361/695, 361/697, 709, 710, 704; 165/80.3
See application file for complete search history.

(56) References Cited

U.S. PATENT DOCUMENTS

| | | | | |
|---|---|---|---|---|
| 5,558,155 | A | * | 9/1996 | Ito .............................. 165/80.3 |
| 5,828,551 | A | * | 10/1998 | Hoshino et al. .............. 361/697 |
| 6,067,227 | A | * | 5/2000 | Katsui et al. ................. 361/695 |
| 6,543,522 | B1 | * | 4/2003 | Hegde ........................ 165/80.3 |
| 6,745,824 | B2 | | 6/2004 | Lee et al. |
| 7,120,020 | B2 | * | 10/2006 | Carter et al. ................. 361/697 |
| 2003/0131970 | A1 | * | 7/2003 | Carter et al. ................. 165/80.3 |
| 2005/0073811 | A1 | * | 4/2005 | Wang et al. .................. 361/688 |

* cited by examiner

*Primary Examiner*—Michael C Zarroli
(74) *Attorney, Agent, or Firm*—Morris Manning Martin LLP; Tim Tingkang Xia, Esq.

(57) ABSTRACT

A heat dissipation device includes a heat sink (10) and a fan (30). The heat sink includes a plurality of fins (15), and a guiding portion (184) is formed in the fins. The fan is secured to the heat sink. An airflow (F) is generated by the fan for flowing through the heat sink. When the airflow meets with the guiding portion, the airflow is deflected. The deflected airflow is guided to flow across heat-generating elements.

17 Claims, 2 Drawing Sheets

HEAT DISSIPATION DEVICE

BACKGROUND OF THE INVENTION

1. Field of the Invention

The present invention relates to heat dissipation devices, and more particularly to a heat dissipation device for dissipating heat from electronic elements on a circuit board.

2. General Background

Generally, a typical heat dissipation device includes a heat sink, heat pipes, a frame, and a fan. Each heat pipe has a lower first connecting portion and an upper second connecting portion. The heat sink includes a base, and parallel fins attached to the base. The base includes a top plate, and defines a hermetically sealed chamber. A plurality of apertures is defined in one side wall of the base, the apertures receiving the first connecting portions. Through holes are transversely defined through the fins, the through holes receiving the second connecting portions. The frame includes an upper plate, and two side plates. Two arms of each side plate secure the frame on the heat sink. In operation, liquid in the chamber transfers heat to the top plate and to the second connecting portions by phase transition.

However, a plurality of other associated electronic elements are usually mounted around a main heat-generating electronic element on a circuit board. The heat generated from the associated electronic elements is difficult to dissipate with the typical heat dissipation device.

What is needed, therefore, is to provide a heat dissipation device which can dissipate the heat from not only the main heat-generating electronic element on a circuit board but any other associated heat-generating electronic elements as well.

SUMMARY

A heat dissipation device includes a heat sink and a fan. The heat sink includes a plurality of fins, and a guiding portion is formed in the fins. The fan is secured to the heat sink. An airflow is generated by the fan for flowing through the heat sink. When the airflow meets with the guiding portion, the airflow is deflected. The deflected airflow is guided to flow across heat-generating elements.

Advantages and novel features of the present invention will be drawn from the following detailed description of a preferred embodiment with attached drawings, in which:

DETAILED DESCRIPTION OF PREFERRED EMBODIMENTS

Figure 1:
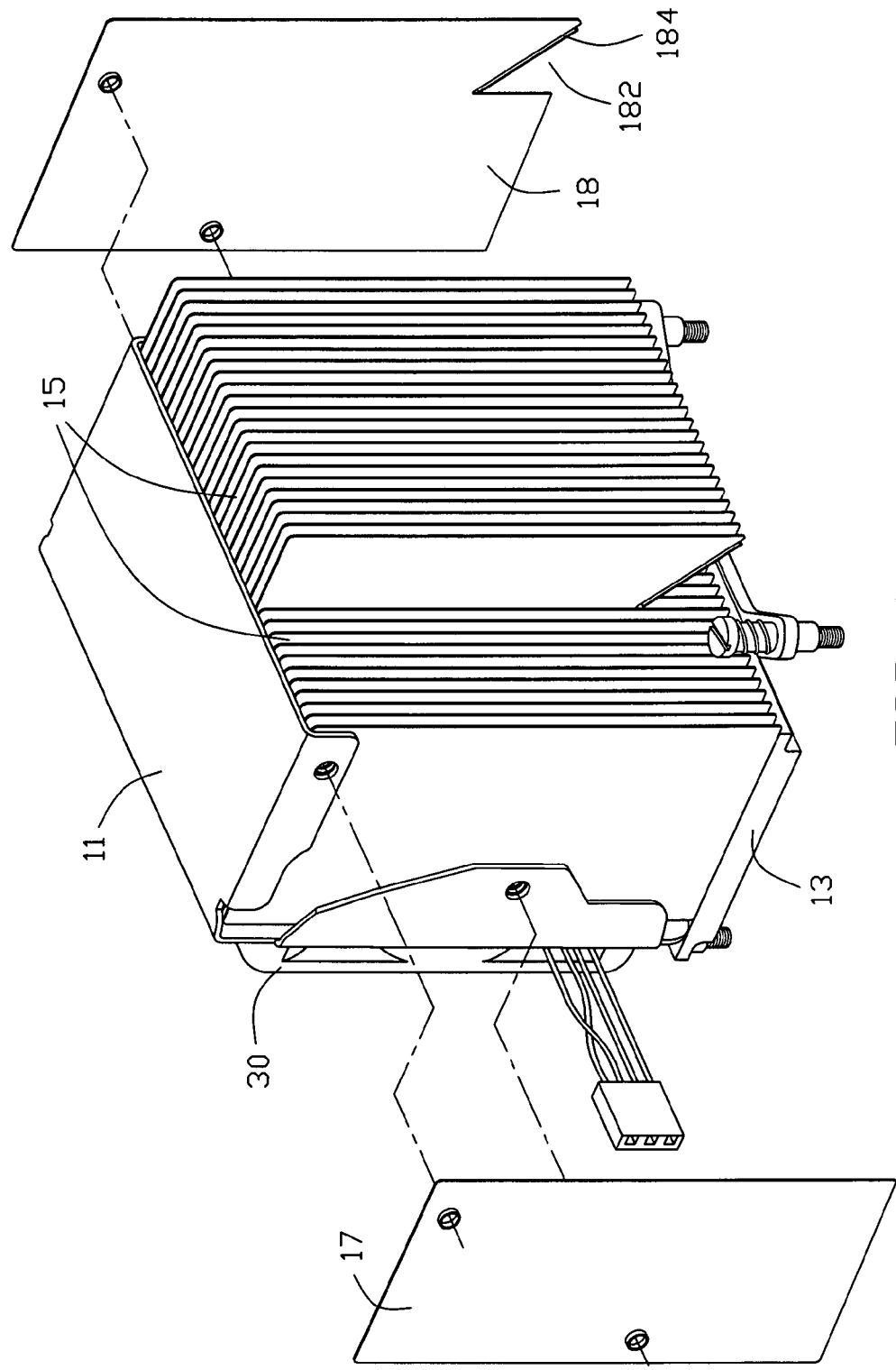
FIG. 1 is an exploded, isometric view of a heat dissipation device of a preferred embodiment of the present invention, the heat dissipation device including a heat sink and a fan.

Referring to FIG. 1, a heat dissipation device includes a heat sink 10 and a fan 30. The heat sink 10 includes a frame 11, a heat-conducting clip 13 and a plurality of parallel fins 15. The fins 15 are secured to the frame 11. The fan 30 is attached to a side of the frame 11, thereby a wind generated by the fan 30 can flow through the fins 15. The heat-conducting clip 13 is connected to a bottom of the fins 15. The fins 15 of the heat sink 10 include a plurality of first fins 17 and second fins 18. The second fins 18 are wider than the fins 15 so as to comprise an extension thereof. A cutout 182 is defined in a bottom of the extension of each fin 18. A slanted and elongated guiding flange 184 is bent perpendicularly from each edge of the cutouts 182. The width of each guiding flange 184 is less than the distance between each adjacent second fins 18 respectively. All the guiding flanges 184 of the heat sink 10 make up a guiding portion.

Figure 2:
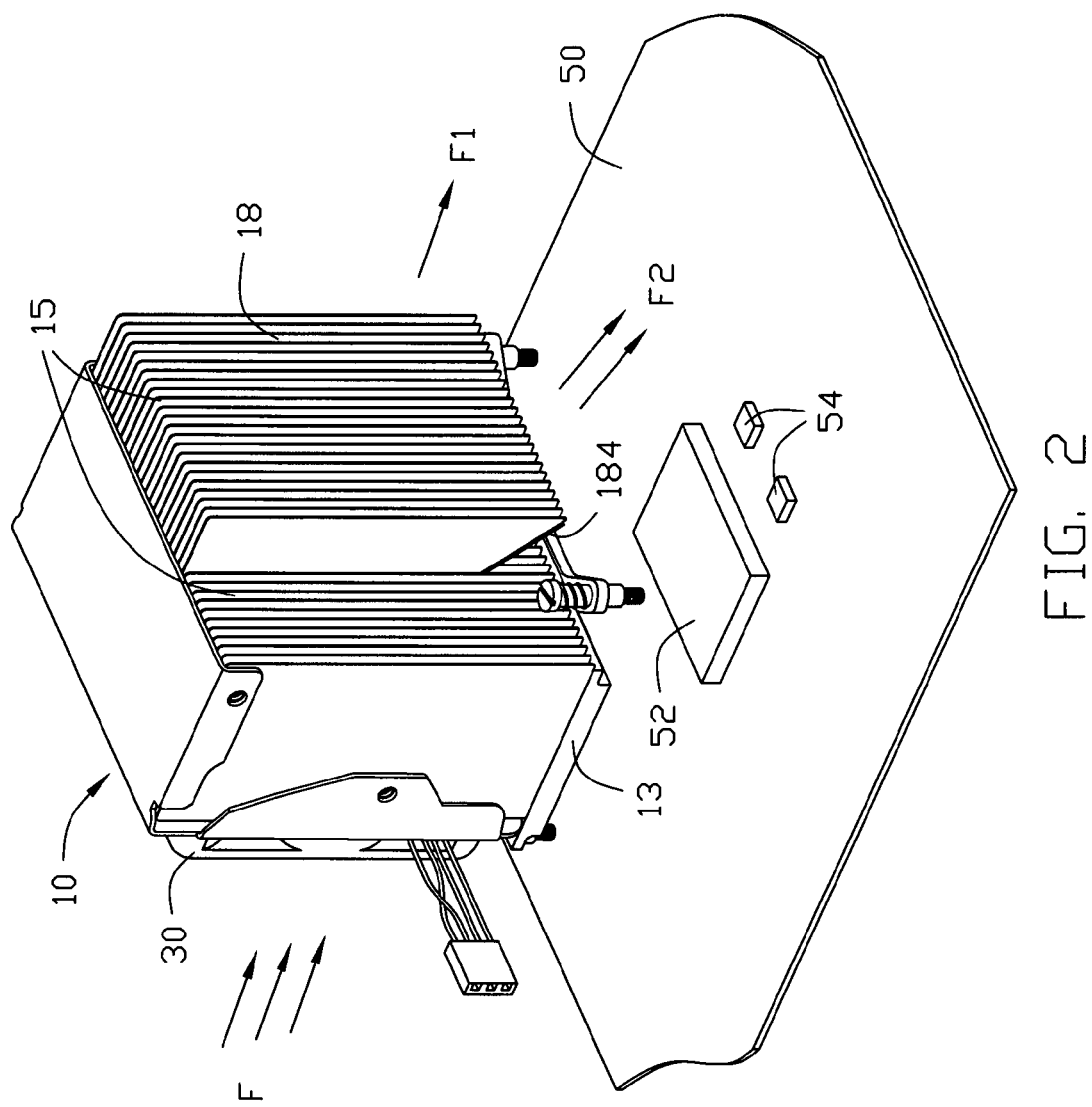
FIG. 2 is an exploded view of the heat dissipation device and a circuit board with a main heat-generating electronic element and other associated heat-generating electronic elements.

Referring also to FIG. 2, a main heat-generating electronic element 52, such as a CPU, is located on a circuit board 50 defining a predetermined plane thereon. And other associated heat-generating electronic elements 54 are disposed on the circuit board 50, adjacent to the main heat-generating electronic element 52.

In assembling the heat sink 10 to the circuit board 50, the heat sink 10 together with the fan 30 is secured to the circuit board 50. The main heat-generating electronic element 52 abuts the heat-conducting clip 13 of the heat sink 10. The electronic elements 54 are positioned under the cutouts 182 of the second fins 18 of the heat sink 10. An acute angle is formed between the guiding flanges 184 and the circuit board 50, and the guiding flanges 184 are disposed pointing at the electronic elements 54 on the circuit board 50.

In dissipating heat from the main heat-generating electronic element 52 and the electronic elements 54, the heat generated from the main heat-generating electronic element 52 is absorbed by the heat-conducting clip of the heat sink 10, and transferred to the fins 15. An airflow F is generated by the fan 30 and flows through the fins 15 of the heat sink 10, as shown in FIG. 2. The top portion of the airflow F blows directly through the fins 15 in the direction F1 for taking the heat out of the heat sink 10. The bottom portion of the airflow F is guided in the direction F2 by the guiding flanges 184, and flows across the electronic elements 54 on the circuit board 50. Thus, the heat generated from the main heat-generating electronic element 52 and the electronic elements 54 is dissipated by the heat sink 10 at the same time.

The guiding portion of the heat sink 10 can also be a guiding surface bending from the frame 11. The airflow F flows through the fins 15 of the heat sink 10 and guided by the guiding surface to the direction F2 for dissipating the heat from the electronic elements 54 of the circuit board 50.

It is to be understood, however, that even though numerous characteristics and advantages have been set forth in the foregoing description of a preferred embodiment, together with details of the structure and function of the preferred embodiment, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat dissipation device, comprising:
    a heat sink comprising a plurality of fins, the fins comprising a plurality of first fins and second fins, a guiding portion formed within the second fins, the guiding portion comprising a plurality of parallel flanges, the flanges formed at a bottom portion of the second fins; and
    a fan secured to the heat sink, an airflow being generated by the fan for flowing through the heat sink, wherein each flange is slanted to a blowing direction of the airflow between two adjacent second fins so that when the airflow meets with the guiding portion, the airflow is deflected.

2. The heat dissipation device as described in claim 1, wherein a cutout is defined under the guiding portion.

3. The heat dissipation device as described in claim 1, wherein the flanges are bent from the bottom edges of the fins.

4. The heat dissipation device as described in claim 1, wherein the width of the flange is less than the span between two adjacent fins.

5. The heat dissipation device as described in claim 1, wherein the heat sink further comprises a heat-conducting clip, and the heat-conducting clip is connected to the fins.

6. A heat dissipation device assembly, comprising:
   a circuit board comprising a main heat-generating element and a plurality of other associated heat-generating elements, the associated elements positioned adjacent the main heat-generating element;
   a heat sink attached to the main heat-generating element, the heat sink comprising a plurality of fins, the fins comprising a plurality of first fins and second fins, a guiding portion formed in the second fins; and
   a fan associated with the heat sink, an airflow being generated by the fan for flowing through the heat sink, wherein when the airflow meets with the guiding portion, the airflow is guided to flow across heat-generating elements.

7. The assembly as described in claim 6, wherein a cutout is defined under the guiding portion.

8. The assembly as described in claim 6, wherein the guiding portion comprises a plurality of parallel flanges, and the flanges are formed at a bottom portion of the fins.

9. The assembly as described in claim 8, wherein the flanges are bent from bottom edges of the fins.

10. The assembly as described in claim 8, wherein each flange is slanted between two adjacent fins, and the width of the flange is less than the span between two adjacent fins.

11. The assembly as described in claim 10, wherein an acute angle is formed between the flanges of the fins and the circuit board, and the flanges are disposed pointing at the associated elements on the circuit board.

12. The assembly as described in claim 6, wherein the heat sink further comprises a heat-conducting clip, and the heat-conducting clip is connected to the fins.

13. An assembly of electronic component arrangement, comprising:
   a first electronic heat-generating component of said assembly to be arranged on a predetermined plane;
   a second electronic heat-generating component of said assembly capable of being arranged beside said first component along and on said predetermined plane; and
   a heat dissipation device removably attachable to said first component so as to gain heat from said first component due to thermal engagement thereof with said first component, and generate forced airflow through said heat dissipation device to remove said gained heat, said heat dissipation device comprising an extension toward said second component so as to guide said generated airflow by means of a bottom of said extension toward said second component in order for removing heat of said second component, wherein said extension comprises a plurality of parallel flanges, and said plurality of flanges are formed at said bottom portion of said extension.

14. The assembly as described in claim 13, wherein said heat dissipation device comprises a plurality of parallel-arranged fins thermally conductible for gaining said heat from said first component so as to allow said generated airflow passing therethrough to remove said heat from said first component, and said extension is formed at a part of said plurality of fins neighboring said second component.

15. The assembly as described in claim 13, wherein said predetermined plane is defined on a circuit board electrically connectable with said first and second components respectively.

16. The assembly as described in claim 14, wherein a width of each flange is less than a span between two adjacent fins.

17. The assembly as described in claim 14, wherein each flange is slanted to a blowing direction of said generated airflow between two adjacent fins.

\* \* \* \* \*